United States Patent
Dinger

(10) Patent No.: US 9,444,214 B2
(45) Date of Patent: Sep. 13, 2016

(54) BEAM GUIDANCE SYSTEM FOR THE FOCUSING GUIDANCE OF RADIATION FROM A HIGH-POWER LASER LIGHT SOURCE TOWARD A TARGET AND LPP X-RAY SOURCE COMPRISING A LASER LIGHT SOURCE AND SUCH A BEAM GUIDANCE SYSTEM

(71) Applicant: Carl Zeiss SMT GmbH, Oberkochen (DE)

(72) Inventor: Udo Dinger, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/320,045

(22) Filed: Jun. 30, 2014

(65) Prior Publication Data

US 2015/0098072 A1    Apr. 9, 2015

Related U.S. Application Data

(63) Continuation of application No. PCT/EP2013/050053, filed on Jan. 3, 2013.

(60) Provisional application No. 61/593,921, filed on Feb. 2, 2012.

(30) Foreign Application Priority Data

Jan. 18, 2012  (DE) ........................ 10 2012 200 693
Feb. 2, 2012    (DE) ........................ 10 2012 201 557

(51) Int. Cl.
*G03F 7/20*   (2006.01)
*H01S 3/034*  (2006.01)
(Continued)

(52) U.S. Cl.
CPC ............. *H01S 3/034* (2013.01); *B23K 26/032* (2013.01); *B23K 26/0643* (2013.01);
(Continued)

(58) Field of Classification Search
CPC  G02B 27/0025; G02B 7/008; G02B 7/1815; G03F 7/702; G03F 7/70225; H05G 2/008; H05G 2/005; H01S 3/2232; H01S 3/034; H01S 3/136; H01S 3/10
See application file for complete search history.

(56) References Cited

U.S. PATENT DOCUMENTS 5,880,891 A      3/1999  Fuerter
2001/0043408 A1  11/2001 Wangler et al.
(Continued)

FOREIGN PATENT DOCUMENTS

DE  196 16 922   10/1997
DE  100 16 176   10/2001
(Continued)

OTHER PUBLICATIONS

International Search Report for corresponding PCT Appln No. PCT/EP2013/050053, dated Apr. 8, 2013.
(Continued)

*Primary Examiner* — Michelle M Iacoletti
(74) *Attorney, Agent, or Firm* — Fish & Richardson P.C.

(57) ABSTRACT

A beam guidance system serves for the focusing guidance of radiation from a high-power laser light source toward a target. The beam guidance system has at least one mirror as reflective beam guidance component and at least one transmission component which is at least partially transmissive to the radiation as refractive beam guidance component. The arrangement of the at least one mirror and of the at least one transmission component is such that beam-induced changes to the beam guidance properties of the at least one mirror are at least partly compensated for by beam-induced changes to the beam guidance properties of the at least one transmission component. This results in a beam guidance system in which beam-induced changes to the beam guidance properties of the beam guidance system do not have a disturbing effect on the focusing guidance of the radiation from the laser light source.

23 Claims, 3 Drawing Sheets

(51) Int. Cl.
  *G02B 27/00* (2006.01)
  *H05G 2/00* (2006.01)
  *G02B 7/00* (2006.01)
  *B23K 26/03* (2006.01)
  *B23K 26/06* (2014.01)
  *G02B 7/18* (2006.01)

(52) U.S. Cl.
  CPC .......... *B23K 26/0648* (2013.01); *G02B 7/008* (2013.01); *G02B 27/0025* (2013.01); *G03F 7/702* (2013.01); *H05G 2/008* (2013.01); *G02B 7/1815* (2013.01)

(56) References Cited

U.S. PATENT DOCUMENTS

| | | |
|---|---|---|
| 2008/0259308 A1 | 10/2008 | Epple |
| 2010/0078577 A1 | 4/2010 | Moriya et al. |
| 2010/0117009 A1 | 5/2010 | Moriya et al. |
| 2010/0171049 A1* | 7/2010 | Moriya .................. H05G 2/008 250/504 R |
| 2011/0180734 A1 | 7/2011 | Moriya et al. |

FOREIGN PATENT DOCUMENTS

| | | |
|---|---|---|
| DE | 10 2008 001 216 | 10/2008 |
| DE | 10 2008 054 779 | 8/2009 |
| DE | 10 2009 029 605 | 4/2010 |
| DE | 10 2009 047 105 | 5/2011 |
| JP | 2005-294087 | 10/2005 |
| WO | WO 2011/063801 | 6/2011 |

OTHER PUBLICATIONS

German Examination Report, with translation thereof, for corresponding DE Appln No. 10 2012 201 557.4, dated Sep. 4, 2012.

R. Koch, "Self-adaptive optical elements for compensation of thermal' lensing effects in diode end-pumped solid state lasers—proposal and preliminary experiments," Optics Communications 140 (1997) 158-164.

* cited by examiner

BEAM GUIDANCE SYSTEM FOR THE FOCUSING GUIDANCE OF RADIATION FROM A HIGH-POWER LASER LIGHT SOURCE TOWARD A TARGET AND LPP X-RAY SOURCE COMPRISING A LASER LIGHT SOURCE AND SUCH A BEAM GUIDANCE SYSTEM

CROSS-REFERENCE TO RELATED APPLICATIONS

The present application is a continuation of, and claims benefit under 35 USC 120 to, international application PCT/EP2013/050053, filed Jan. 3, 2013, which claims benefit under 35 USC 119 of German Application Nos. 10 2012 200 693.1, filed Jan. 18, 2012 and 10 2012 201 557.4, filed Feb. 2, 2012. International application PCT/EP2012/054664 also claims priority under 35 USC 119(e) to U.S. Provisional Application No. 61/593,921, filed Feb. 2, 2012. The entire disclosure of international application PCT/EP2013/050053, German Application No. 10 2012 200 693.1 and German Application No. 10 2012 201 557.4 are incorporated by reference herein.

1 FIELD OF APPLICATION AND PRIOR ART

The invention relates to a beam guidance system for the focusing guidance of radiation from a high-power laser light source toward a target.

This invention relates, in particular, to the beam guidance system of the laser in an LPP (laser produced plasma) source for EUVL (radiation or light having a wavelength in the extreme ultraviolet). The invention furthermore relates to an LPP x-ray source comprising a laser light source and such a beam guidance system.

The laser plasma sources currently preferred for EUV lithography use $CO_2$ high-power lasers that are focused onto a material particle, for example onto a metal droplet, in particular onto a tin droplet. A hot, dense plasma is produced as a result, the plasma emitting 13.5 nm radiation. A used wavelength of the x-ray radiation produced can also be in the region of 6.8 nm. In this case, a droplet composed of gadolinium (Gd) or composed of terbium (Tb) can be used as material particle.

In order to achieve EUV powers in the region of 200 watts at the so-called intermediate focus of an EUVL system, average $CO_2$ laser powers of typically 35 kW are required. The associated wavelength is 10.6 μm.

In order to ignite the plasma efficiently, it is essential to ensure the highest possible laser intensity at the location of the target. The target typically consists of small (diameter of approximately 10-100 μm) tin droplets, which have to be hit accurately with an accuracy of a few μm to a few tens of μm.

Focusing the laser onto the target is the task of the beam guidance system. Only (copper) mirrors and a few materials (diamond, ZnSe and ZnS, GaAs, Ge, Si) for refractive elements are available as optical components in this system.

2 STATEMENT OF PROBLEM AND DISADVANTAGE OF THE PRIOR ART

The beam guidance systems currently being discussed substantially consist of water-cooled copper deflection mirrors and diamond windows. Other materials are not resistant in the range of small beam cross sections and high laser powers and can be used at most in the range of lower intensities.

The high laser intensities and the finite absorption of the coated or even uncoated mirrors result in a deformation of the mirror surfaces, which in turn deform the wavefronts of the laser beam. Coatings are stable only up to a limit value laser intensity. At higher intensities, they must be dispensed with for service life reasons.

Beam-induced changes to the beam guidance properties are changes brought about by a beam-induced material expansion and/or by a beam-induced change in the refractive index of the respective beam guidance component.

The leading aberrations introduced in this way are:
1.) Defocus: under the influence of the laser radiation, all the mirror surfaces bulge in the same direction, i.e. the effect cumulates upon passage through the system, which, including the mirrors in the power amplifiers, can have several dozen mirrors, with the result that a significant focus offset that cannot be afforded tolerance can add up. The laser is defocused in this case.
2.) The mirrors are used substantially as 90° deflection mirrors; this gives rise to an asymmetry in the thermal loading which substantially leads to an astigmatism and thus to a reduction in the achievable peak intensity. Depending on the relative arrangement of the different mirrors, the contributions thereof can add up or compensate for one another.
3.) A wavefront tilt and thus a lateral offset of the beam can occur as a result of symmetry breaking in the mounts.
4.) Higher orders of these disturbances (coma, spherical aberration, higher astigmatism, . . . ) can result in an additional reduction in the peak intensity (Strehl factor).

Overall, the stability and power of the laser plasma are greatly impaired by these mirror heating effects.

Therefore, if they are unavoidable, very complex control and regulating mechanisms must be incorporated into the beam guidance system in order to stabilize the system by feed-back or, if appropriate, feed-forward.

A problem addressed by the present invention is that of developing a beam guidance system of the type mentioned in the introduction in such a way that beam-induced changes to the beam guidance properties of the beam guidance system do not have a disturbing effect on the focusing guidance of the radiation from the laser light source.

This problem is solved according to the invention via a beam guidance system for the focusing guidance of radiation from a high-power laser light source having a wavelength of the radiation in the range of between 9.5 μm and 11 μm toward a target. The beam guidance system includes at least one mirror as reflective beam guidance component and at least one transmission component which is at least partially transmissive to the radiation as refractive beam guidance component. The arrangement of the at least one mirror and of the at least one transmission component is such that beam-induced changes to the beam guidance properties of the at least one mirror are at least partly compensated for by beam-induced changes to the beam guidance properties of the at least one transmission component.

3. INVENTIVE SOLUTION

According to the invention it has been recognized that beam-induced changes to the beam guidance properties of the at least one mirror of the beam guidance system can be at least partly compensated for by beam-induced changes to the beam guidance properties of the at least one transmission component, since component arrangements are readily possible in which the beam-induced changes counteract one another. This makes use of the fact that an induced material expansion and a beam-induced change in refractive index in the case of the at least one transmission component affect the beam guidance fundamentally differently than a beam-induced material expansion in the case of the at least one mirror.

The beam guidance system can comprise a plurality of mirrors. The beam guidance system can comprise a plurality of transmission components. The mirrors and/or the transmission components can be combined to form reflective and/or refractive component groups or else be arranged alternately in the beam path of the beam guidance system.

In particular, thermally induced or intensity-induced changes to the beam guidance properties could be compensated for. The laser light source can generate in particular radiation in the IR range and in particular in the MIR range (medium infrared, wavelength range between 2.5 µm and 25 µm). The laser light source can be a $CO_2$ laser having an emission wavelength of 9.6 µm, and/or of 10.3 µm and/or of 10.6 µm.

As an alternative or in addition to a high-power laser light source having a wavelength in the range of between 9.5 µm and 11 µm, the beam guidance system can also be embodied for the focusing guidance of radiation from a high-power laser light source having a wavelength in the range of between 800 nm and 1200 nm.

The high-power laser light source can have a cw power of the laser radiation in the range of between 500 W and 100 kW, in particular in the range of between 1 kW and 50 kW, for example in the region of 35 kW. The cw power of the laser radiation of the high-power laser light source can be greater than 15 kW or can be greater than 20 kW.

An at least partial compensation of the beam-induced changes to the beam guidance properties which are brought about by the at least one mirror, on the one hand, and by the at least one transmission component, on the other hand, is present if the compensated beam guidance property corresponds to a predefined value better by at least 5% than an uncompensated beam guidance property. The compensated beam guidance property can correspond to a predefined value better by more than 10%, better by more than 25% or even better by more than 50%. The compensation effect can be, in particular, such that the predefined value is attained exactly.

These relative compensation values shall be explained with the aid of an example:

A focal position F of the radiation in the region of the target 5 shall be predefined as beam guidance property. The predefined value shall be a beam position $F=z_0$ in the beam guidance direction z. A beam-induced change to the beam guidance properties of the at least one mirror leads to a change in the focal position toward a value $z_0+\delta z_S$. The beam-induced change to the focal position, brought about by the transmission component, leads to a focal position $z_0-\delta z_T$. The focal position has then changed to a value $F=z_0+\delta z_S-\delta z_T$ on account of the beam-induced changes to the beam guidance properties of the at least one mirror and the beam-induced changes to the beam guidance properties of the at least one transmission component. An at least partial compensation is achieved if the following holds true: $\delta z_T \geq 0.05 \cdot \delta z_S$. In particular, the following holds true: $\delta z_T \geq 0.1 \cdot \delta z_S$, $\delta z_T \geq 0.25 \cdot \delta z_S$, $\delta z_T \geq 0.5 \cdot \delta z_S$. In particular, the following holds true: $\delta z_S = \delta z_T$.

Corresponding compensation conditions also hold true for the other leading aberrations mentioned above.

In an embodiment in which the transmission component is embodied as a plane-parallel plate, the possibility of a compensation of astigmatism arises. As an alternative or in addition to a plane-parallel plate, at least one transmission component having a focusing or defocusing effect, e.g. one or a plurality of lens elements, can also be used in the beam guidance system.

Having the transmission component embodied as a wedge plate enables a compensation of thermally induced coma aberrations or of tilting aberrations, that is to say in particular a compensation of disturbances that exhibit one-fold rotational symmetry.

A transmission component that is tiltable in the beam path of the guidance system enables a targeted setting of its compensation influence.

Having the transmission component have a compensation surface profile for at least partly compensating for beam guidance aberrations produced by the laser light source and/or by a component of the beam guidance system enables a compensation of steady-state beam guidance aberrations. The compensation surface profile can be embodied in the form of a correction asphere. Such correction aspheres are known for use in projection optical units for projection exposure apparatuses. In this connection, reference is made for example to DE 10 2008 001 216 A1 and to DE 100 16 176 A1.

ZnSe is a suitable material for the at least one transmission component on account of its transmission properties. Alternatively, the transmission component can be produced from ZnS, GaAs, germanium, silicon, diamond or other sufficiently transparent materials.

Mirrors with a reflection surface composed of copper have proved worthwhile for guiding high-power laser radiation in particular in the MIR range.

The at least one mirror having pure deflection properties for the radiation in the starting state, that is to say without impingement by the radiation from the high-power laser light source, is a pure deflection mirror, that is to say in particular a plane mirror.

As an alternative to such a deflection mirror, at least one mirror having a focusing or defocusing effect can also be used. Concave mirrors and/or convex mirrors can therefore be used.

The at least one transmission component can be accommodated in a gas-tight housing having at least one mirror which is transmissive to the radiation. Such a housing avoids a degradation of the transmission components accommodated there as a result of ambient influences, e.g. as a result of dust. The housing can be evacuated or filled with a protective gas or inert gas. The housing windows can be diamond windows. The housing additionally prevents a contamination of the surroundings in the case of a thermally induced destruction of the compensator.

The beam guidance system can include a sensor module for detecting the focus of the radiation in the region of the target, a displacement drive for displacing the transmission component, and a control/regulating device signal-connected to the sensor module and the displacement drive. Such a configuration enables a regulated compensation of the beam-induced changes to the beam guidance properties of the beam guidance system.

A beam guidance system for the focusing guidance of radiation from a further laser light source having a wavelength of the radiation in the range of between 800 nm and 1200 nm can be embodied for simultaneously guiding the radiation from a high-power laser light source for producing a main pulse and for guiding the radiation from a further laser light source for producing a prepulse. The main pulse can then have the wavelength in the range of between 9.5 µm and 11 µm and the power ranges explained above. The prepulse can have the wavelength in the range of between 800 nm and 1200 nm. The prepulse can have a cw power in the range of between 200 W and 1000 W, in particular in the range of between 300 W and 1000 W. The power of the prepulse is typically 10% of the power of the main pulse.

In principle, embodiments are also possible in which both the prepulse and the main pulse have a wavelength range of between 9.5 µm and 11 µm. A further embodiment is also possible in which both the prepulse and the main pulse have a wavelength in the range of between 800 nm and 1200 nm. The components of the beam guidance system can all be designed such that they create different wavelengths, that is to say on the one hand in the range between 9.5 µm and 11 µm and on the other hand between 800 nm and 1200 nm. Alternatively, it is possible for the beam guidance system to be subdivided into partial beam guidance systems via corresponding beam splittings, in particular via dichroic beam splittings, wherein one of the beam guidance systems is embodied exclusively for guiding radiation in the range of between 9.5 µm and 11 µm and/or one partial beam guidance system is embodied exclusively for guiding radiation in the range of between 800 nm and 1200 nm.

A laser produced plasma x-ray source can comprise a high-power laser light source and a beam guidance system described herein. The advantages of such an x-ray source correspond to those which have already been explained above with reference to the beam guidance system according to the invention. The laser light source of the x-ray source can be subdivided into a prepulse laser light source and a main pulse laser light source. The wavelengths of the prepulse and of the main pulse can be identical, but can also be different.

Some explanations concerning advantageous configurations of the beam guidance system and of the x-ray source will also be given below:

According to the invention, the problem is solved by one or a plurality of components composed of ZnSe being introduced into the beam guidance system.

This ensues at locations in the beam guidance system which are non-critical with regard to the radiation loading for ZnSe. This can take place e.g. at locations in the amplifier chain at which the laser power is still at a moderate level, or at correspondingly expanded locations at which the laser intensity is sufficiently low.

Use is made of the fact that, as a result of the temperature dependence of the refractive index of ZnSe, this material in the event of a temperature increase has a focusing effect on the laser beam and can thus compensate for the induced defocusing effect of the mirrors.

The magnitude of this effect is dependent on the thickness of the material and the laser power.

Since it can be assumed that both the effect induced by the mirrors and the effect induced by a ZnSe plane-parallel plate are more or less linear in the laser power, for a fixed configuration it is possible to determine an optimum ZnSe thickness which (for the most part) compensates for the laser-induced focus effects for favored powers.

By suitably tilting such a ZnSe plate having a suitable thickness in the beam path, it should be possible—via the same mechanism that produces astigmatism in the mirrors—to produce a compensating astigmatism profile, such that the astigmatism of the overall system can also be compensated for power-independently.

Thermally induced coma or tilt (one-fold disturbances) can be compensated for by a suitable wedge composed of ZnSe being introduced.

In addition, steady-state beam aberrations, caused by mount, cooling and other effects, can be compensated for by a suitable surface profile being impressed.

Ideally, all these compensation mechanisms could be realized in a tailor-made tilted ZnSe wedge of defined thickness with an integrated correction profile.

An implementation of the invention can, of course, also be generalized to other materials and wavelengths.

One aspect of the invention can be formulated as follows: beam guidance system for a $CO_2$ laser, characterized in that wavefront deformations thermally induced by the mirrors are compensated for power-independently by an arrangement of plate-shaped or wedge-shaped ZnSe elements.

4 EXEMPLARY EMBODIMENTS

Exemplary embodiments of the invention are explained in greater detail below with reference to the drawing, in which:

FIG. 1 schematically shows an x-ray source comprising a laser light source and a beam guidance system;

Figure 1:
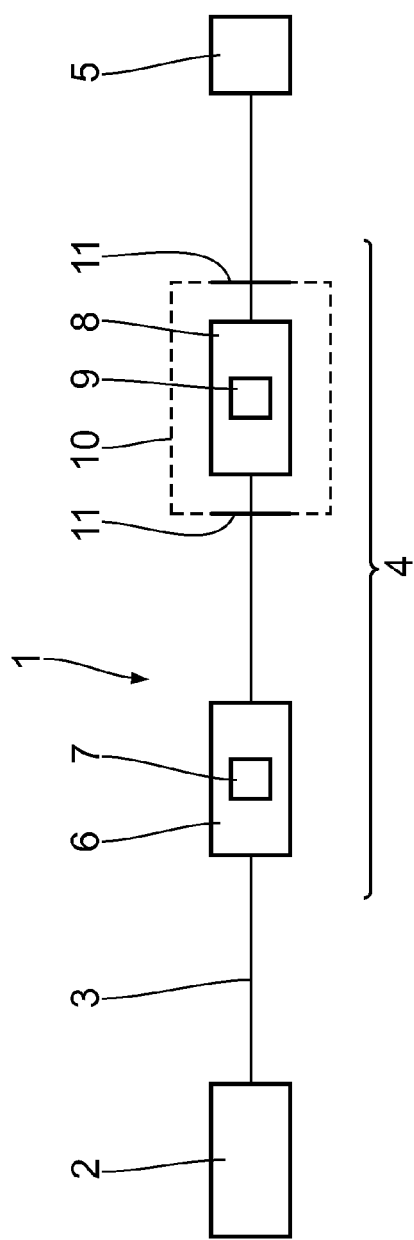

FIG. 1 schematically shows an x-ray source 1. The x-ray source 1 serves for generating x-ray radiation, in particular in the EUV (extreme ultraviolet) wavelength range, for example in the wavelength range of between 5 nm and 30 nm. The x-ray source 1 is an LPP (laser produced plasma) x-ray source.

The x-ray source 1 has a laser light source 2, which generates laser radiation 3. The laser light source 2 is a high-power laser light source having a cw power of the laser radiation 3 in the kW range, that is to say for example in the range of between 500 W and 100 kW, in particular in the range of between 1 kW and 50 kW, for example in the region of 35 kW. The laser radiation 3 has a wavelength in the IR range, in particular in the MIR range. The laser light source 2 is a $CO_2$ laser. The laser light source 2 can be subdivided into a prepulse source and into a main pulse source, as is known in principle for LPP x-ray sources. The power ranges mentioned above then apply to the main pulse source. The prepulse source can have a cw power of the laser radiation in the range of between 200 W and 1000 W, in particular in the range of between 300 W and 1000 W. An Nd solid-state laser, in particular an Nd:YAG laser, can be used as the prepulse source. In principle, an embodiment is also possible in which the high-power laser light source, and in particular the main pulse source, is embodied as such an Nd solid-state laser.

The x-ray source 1 furthermore comprises a beam guidance system 4. The latter serves for the focusing guidance of the laser radiation 3 from the laser light source 2 toward a target 5. The target is a tin droplet having a typical diameter in the range of between 10 µm and 100 µm, and in particular having a typical diameter of 30 µm. The beam guidance system 4 is embodied such that the target 5 is hit accurately with a beam guidance accuracy in the range of 1 µm to a few tens of µm.

The beam guidance system 4 comprises a reflective component group 6 having at least one mirror 7 as reflective beam guidance component and a refractive component group 8 having at least one transmission component 9 which is at least partially transmissive to the radiation as refractive beam guidance component. The reflective component group 6 can comprise exactly one mirror 7, but can also comprise a plurality of mirrors. The refractive component group 8 can comprise exactly one transmission component 9, but can also comprise a plurality of transmission components. Mirrors 7 and transmission components 9 of the beam guidance system 4 can also be arranged alternately in the beam path of the beam guidance system 4, as is indicated by way of example in FIG. 2, where a transmission component 9 is arranged between two mirrors 7 in the beam path of the laser radiation 3. In the same way, in an embodiment that is not illustrated, a mirror 7 can also be arranged between two transmission components 9.

The arrangement of the at least one mirror 7 and of the at least one transmission component 9 within the beam guidance system 4 is such that beam-induced changes to the beam guidance properties of the at least one mirror 7 are at least partly compensated for by beam-induced changes to the beam guidance properties of the at least one transmission component 9.

The beam-induced changes to the beam guidance properties of the at least one mirror 7 arise in particular as a result of a beam-induced heating of a portion of the reflection surface of the mirror 7 on which radiation impinges, and an associated change in a topography of the reflection surface on account of a thermal expansion of the mirror material.

Beam-induced changes to the beam guidance properties of the at least one transmission component can arise as a result of beam-induced changes in the refractive index of the component material and likewise as a result of a change in a topography of the component surfaces that refract the laser radiation 3 on account of a thermal expansion of the transmission component 9 in particular on account of a residual absorption of the laser radiation 3.

The transmission component 9 is produced from ZnSe (zinc selenide). Alternatively, the transmission component 9 can also be produced from ZnS, Ge, GaAs, silicon, diamond or other materials having sufficient transmission.

The at least one mirror 7 has a reflection surface composed of copper. It can have an absorption-reducing coating. Other mirror materials are also conceivable in the range of lower intensities. The at least one mirror 7 can have pure deflection properties. Alternatively, it is possible for the mirror 7 to have a focusing or a defocusing effect on the laser radiation 3.

Figure 2:
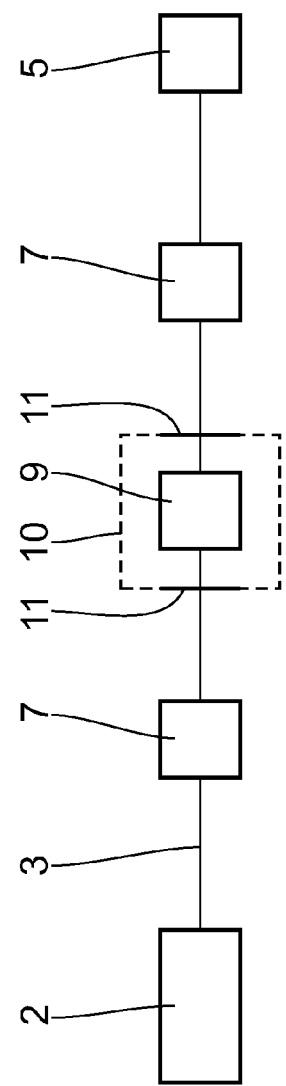
FIG. 2 shows, in an illustration similar to FIG. 1, a further embodiment of an x-ray source comprising a laser light source and a beam guidance system.

The at least one transmission component 9 or else an entire refractive component group 8 can, as is illustrated by dashed lines in FIGS. 1 and 2, be accommodated in a gas-tight housing 10 having at least one window 11 which is transmissive to the laser radiation 3. The interior of the housing 10 can be evacuated. Alternatively or additionally, the interior of the housing 10 can have an inert gas atmosphere.

Figure 3:
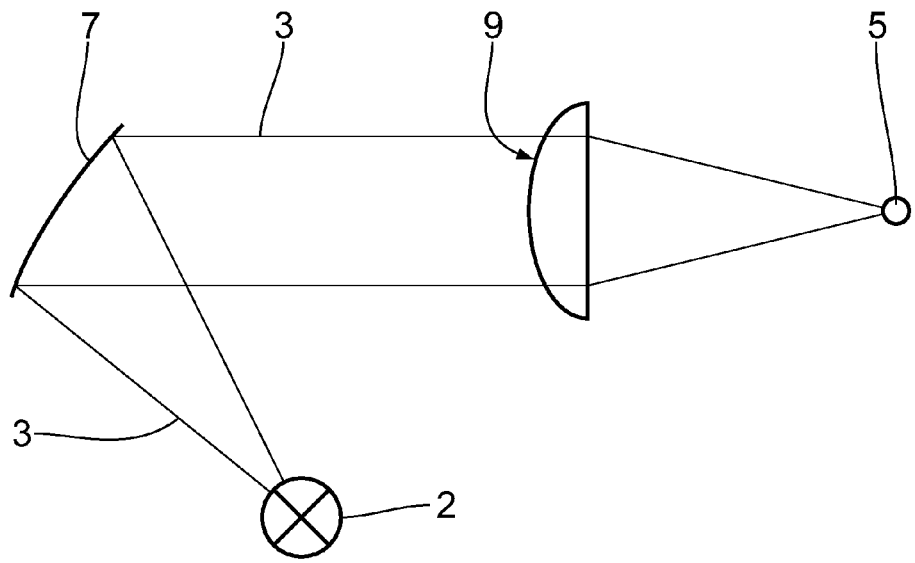
FIGS. 3 to 5 show, likewise schematically but in greater detail, various embodiments of the x-ray source according to FIG. 1.

In the embodiment according to FIG. 3, the mirror 7 is embodied as a concave collimation mirror. The transmission component 9 is embodied as a planoconvex lens element. An embodiment of the transmission component as a biconvex lens element or as a meniscus lens element is also possible. In an embodiment that is not illustrated, at least one of the transmission components 9 can be embodied as a defocusing lens element, for example as a planoconcave lens element or as a biconcave lens element.

Different variants for the beam guidance system 4 are explained below with reference to FIGS. 3 to 6. Components corresponding to those which have already been explained above with reference to FIGS. 1 and 2 bear the same reference numerals and will not be discussed in detail again.

Figure 4:
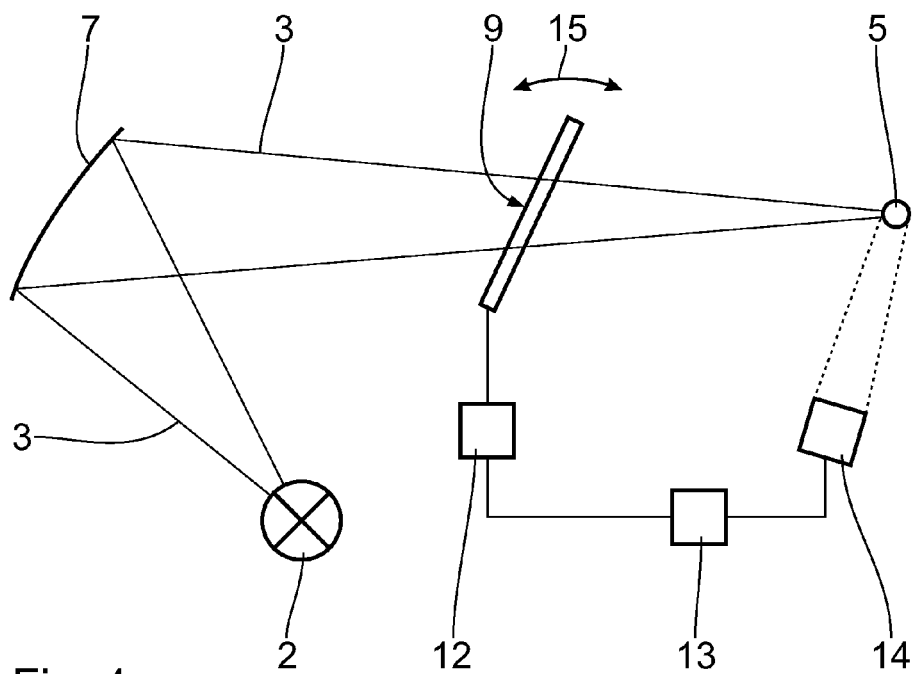

In the case of the embodiment according to FIG. 4, the mirror 7 is embodied as a concave focusing mirror. The transmission component 9 is embodied as a plane-parallel plate. The plane-parallel plate 9 according to FIG. 4 is mechanically operatively connected to a tilting drive 12 for the controlled tilting of the plane-parallel plate 9. The tilting drive 12 is signal-connected to a control/regulating device 13. The latter is signal-connected to an imaging optical sensor module 14, which detects a beam focus of the laser radiation 3 in the region of the target 5. Depending on the focus image result which is detected by the sensor module 14 and which is evaluated in the control/regulating device 13 with the aid of a corresponding algorithm, a tilting angle of the plane-parallel plate 9 in the beam path of the laser radiation 3 is readjusted via the tilting drive 12, as is indicated by a double-headed arrow 15 in FIG. 4.

Figure 5:
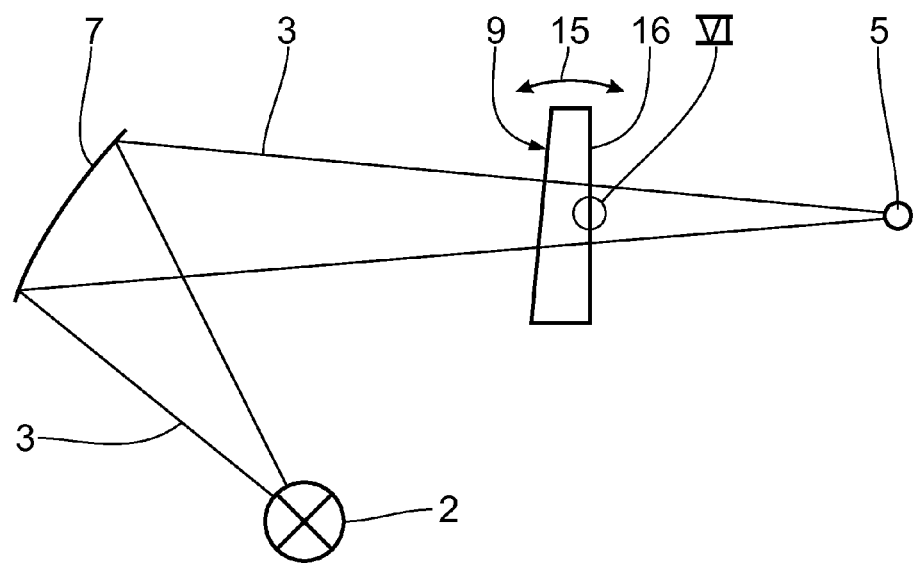
Figure 6:
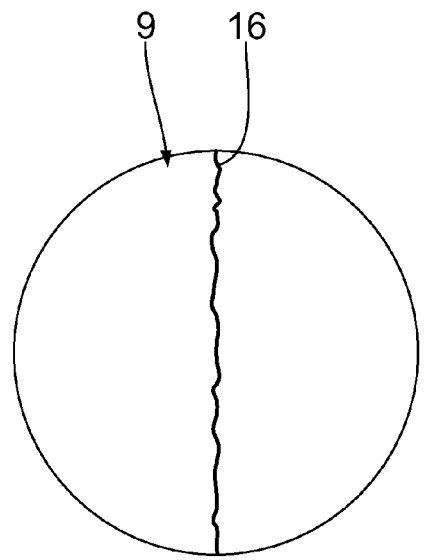
FIG. 6 shows an excerpt enlargement in accordance with detail VI from FIG. 5.

In the case of the embodiment according to FIG. 5, a wedge plate serves as transmission component 9. The two optical surfaces of the wedge plate 9 through which the laser radiation 3 is driven have a wedge angle with respect to one another which is in the range of between 1° and 30°. The wedge plate 9 can also be tilted in a regulated fashion (double-headed arrow 15), as has already been explained in connection with the plane-parallel plate 9 according to FIG. 4.

An exit surface 16 of the wedge plate 9 is embodied as a compensation surface profile (cf. the excerpt enlargement according to FIG. 6) for at least partly compensating for beam guidance aberrations produced by the laser light source 2 and/or by one of the further components of the beam guidance system 4. In particular, steady-state beam guidance aberrations can be compensated for with the aid of the compensation surface profile.

The invention claimed is:

1. A system, comprising:
   a mirror configured to reflect and guide radiation having a wavelength of between 9.5 µm and 11 µm toward a target; and
   a transmission component which is at least partially transmissive to the radiation, the transmission component being configured to refract and guide the radiation toward the target,
   wherein the mirror and the transmission component are configured so that, during use of the system, beam-induced changes to beam guidance properties of the mirror are at least partly compensated for by beam-induced changes to the beam guidance properties of the transmission component, and the transmission component has a compensation surface profile configured to at least partly compensate beam guidance aberrations produced by a component of the system.

2. The system of claim 1, wherein the transmission component comprises a plane-parallel plate.

3. The system of claim 1, wherein the transmission component comprises a wedge plate.

4. The system of claim 1, wherein the transmission component is tiltable in a path of the radiation through the system.

5. The system of claim 1, wherein the transmission component has a compensation surface profile configured to at least partly compensate beam guidance aberrations produced by a laser light source configured to provide the radiation.

6. The system of claim 1, wherein the transmission component comprises ZnSe.

7. The system of claim 1, wherein the mirror comprises a reflection surface comprising copper.

8. The system of claim 1, wherein, in a starting state, the mirror has pure deflection properties for the radiation.

9. The system of claim 1, further comprising:
a housing comprising a window which is transmissive to the radiation; and
a second mirror,
wherein the transmission component and the second mirror are accommodated in the housing.

10. The system of claim 1, further comprising:
a sensor module configured to detect a focus of the radiation in a region of the target;
a displacement drive configured to displace the transmission component; and
a control/regulating device signal-connected to the sensor module and the displacement drive.

11. The system of claim 1, wherein the system is configured to provide focus guidance of radiation from a second radiation source, and the second radiation source is a laser light source having a wavelength of the radiation in the range of between 800 nm and 1200 nm.

12. The system of claim 1, further comprising a laser configured to provide the radiation.

13. The system of claim 12, wherein the laser is configured so that the radiation has a cw power between 500 W and 100 kW.

14. The system of claim 12, wherein the laser is a $CO_2$ laser.

15. The system of claim 1, wherein the system comprises:
a plurality of mirrors configured to reflect and guide the radiation toward the target; and
a plurality of a transmission components which are at least partially transmissive to the radiation, the transmission components being configured to refract and guide the radiation toward the target,
wherein the mirrors and the transmission components are configured so that beam-induced changes to beam guidance properties of the mirrors are at least partly compensated for by beam-induced changes to the beam guidance properties of the transmission components.

16. The system of claim 1, wherein the beam-guidance changes comprise at least one member selected from the group consisting of thermally-induced changes and intensity-induced changes.

17. The system of claim 1, wherein the mirror and the transmission component are configured so that, during use of the system, beam-induced changes to beam guidance properties of the mirror are at least partly compensated for by beam-induced changes to the beam guidance properties of the transmission component so that a compensated beam guidance property corresponds to a predefined value at least 5% more than an uncompensated beam guidance property.

18. A source, comprising:
a laser light source configured to generate radiation having a cw power between 500 W and 100 kW; and
the system of claim 1,
wherein the source is a laser produced plasma x-ray source.

19. An optical system, comprising:
the system of claim 1,
wherein the optical system is EUV lithography system.

20. A system, comprising:
a laser configured to generate radiation having a wavelength in the range of between 9.5 μm and 11 μm with a cw power between 500 W and 100 kW;
a mirror configured to reflect and guide the radiation toward a target; and
a transmission component which is at least partially transmissive to the radiation, the transmission component comprising ZnSe, and the transmission component being configured to refract and guide the radiation toward the target,
wherein the mirror and the transmission component are configured so that, during use of the system, beam-induced changes to beam guidance properties of the mirror are at least partly compensated for by beam-induced changes to the beam guidance properties of the transmission component so that a compensated beam guidance property corresponds to a predefined value at least 5% more than an uncompensated beam guidance property.

21. A source, comprising:
a laser light source configured to generate radiation having a cw power between 500 W and 100 kW; and
the system of claim 20,
wherein the source is a laser produced plasma x-ray source.

22. An optical system, comprising:
the system of claim 20,
wherein the optical system is EUV lithography system.

23. A system, comprising:
a mirror configured to reflect and guide radiation having a wavelength of between 9.5 μm and 11 μm toward a target; and
a transmission component which is at least partially transmissive to the radiation, the transmission component being configured to refract and guide the radiation toward the target,
wherein the mirror and the transmission component are configured so that, during use of the system, beam-induced changes to beam guidance properties of the mirror are at least partly compensated for by beam-induced changes to the beam guidance properties of the transmission component so that a compensated beam guidance property corresponds to a predefined value at least 5% more than an uncompensated beam guidance property.

* * * * *